(12) United States Patent
Lopez et al.

(10) Patent No.: US 9,305,872 B2
(45) Date of Patent: *Apr. 5, 2016

(54) DC-DC CONVERTER HAVING TERMINALS OF SEMICONDUCTOR CHIPS DIRECTLY ATTACHABLE TO CIRCUIT BOARD

(71) Applicant: Texas Instruments Incorporated, Dallas, TX (US)

(72) Inventors: Osvaldo Jorge Lopez, Annandale, NJ (US); Jonathan Almeria Noquil, Bethlehem, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/800,903

(22) Filed: Jul. 16, 2015

(65) Prior Publication Data

US 2015/0318233 A1    Nov. 5, 2015

Related U.S. Application Data

(60) Division of application No. 14/481,204, filed on Sep. 9, 2014, which is a continuation-in-part of application No. 14/173,147, filed on Feb. 5, 2014.

(51) Int. Cl.

| H01L 23/495 | (2006.01) |
|---|---|
| H01L 25/16 | (2006.01) |
| H01L 25/00 | (2006.01) |
| H01L 23/00 | (2006.01) |
| H01L 25/07 | (2006.01) |
| H01L 23/31 | (2006.01) |

(52) U.S. Cl.
CPC .... *H01L 23/49575* (2013.01); *H01L 23/49503* (2013.01); *H01L 23/49524* (2013.01); *H01L 23/49548* (2013.01); *H01L 23/49551* (2013.01); *H01L 23/49562* (2013.01); *H01L 24/49* (2013.01); *H01L 24/85* (2013.01); *H01L 25/072* (2013.01); *H01L 25/16* (2013.01); *H01L 25/50* (2013.01); *H01L 23/3107* (2013.01); *H01L 2224/45015* (2013.01); *H01L 2224/48106* (2013.01); *H01L 2224/48108* (2013.01); *H01L 2224/48247* (2013.01); *H01L 2224/49173* (2013.01); *H01L 2224/85* (2013.01); *H01L 2924/00014* (2013.01); *H01L 2924/1306* (2013.01); *H01L 2924/13091* (2013.01); *H01L 2924/14* (2013.01); *H01L 2924/1425* (2013.01); *H01L 2924/1426* (2013.01); *H01L 2924/181* (2013.01)

(58) Field of Classification Search
USPC ........................................................ 361/715
See application file for complete search history.

(56) References Cited

U.S. PATENT DOCUMENTS

2013/0077250 A1    3/2013  Herbsommer et al.

FOREIGN PATENT DOCUMENTS

EP         2393113 A1    12/2011

OTHER PUBLICATIONS

PCT/US2015/014655 Search Report mailed Jun. 18, 2015.

*Primary Examiner* — Alexander Ghyka
(74) *Attorney, Agent, or Firm* — Steven A. Shaw; Frank D. Cimino

(57) ABSTRACT

A power supply system has a QFN leadframe with leads and a pad. The pad surface facing a circuit board has a portion recessed with a depth and an outline suitable for attaching side-by-side the sync and the control FET semiconductor chips. The input terminal of the control FET and the grounded output terminal of the sync FET are coplanar with the un-recessed portion of the pad (switch node terminal) so that all terminals can be directly attached to contacts of a circuit board. A driver-and-control chip is vertically stacked to the opposite pad surface and encapsulated in a packaging compound.

8 Claims, 7 Drawing Sheets

US 9,305,872 B2

DC-DC CONVERTER HAVING TERMINALS OF SEMICONDUCTOR CHIPS DIRECTLY ATTACHABLE TO CIRCUIT BOARD

CROSS REFERENCE TO RELATED APPLICATIONS

This application is a Divisional of and claims priority to U.S. patent application Ser. No. 14/481,204 filed on Sep. 9, 2014, which is a continuation-in-part of U.S. patent application Ser. No. 14/173,147 filed Feb. 5, 2014. Said application incorporated herein by reference.

FIELD

Embodiments of the invention are related in general to the field of semiconductor devices and processes, and more specifically to the structure and fabrication method of thin packaged synchronous Buck converters, which are free of clips and have chips embedded outside the package in a pre-coined recess of the leadframe.

DESCRIPTION OF RELATED ART

Among the popular families of power supply circuits are the power switching devices for converting on DC voltage to another DC voltage. Particularly suitable for the emerging power delivery requirements are the Power Blocks with two power MOS field effect transistors (FETs) connected in series and coupled together by a common switch node; such assembly is also called a half bridge. When a regulating driver and controller is added, the assembly is referred to as Power Stage or, more commonly, as Synchronous Buck Converter. In the synchronous Buck converter, the control FET chip, also called the high-side switch, is connected between the supply voltage $V_{IN}$ and the LC output filter, and the synchronous (sync) FET chip, also called the low side switch, is connected between the LC output filter and ground potential. The gates of the control FET chip and the sync FET chip are connected to a semiconductor chip including the circuitry for the driver of the converter and the controller; the chip is also connected to ground potential.

For many of today's power switching devices, the chips of the power MOSFETs and the chip of the driver and controller IC are assembled horizontally side-by-side as individual components. Each chip is typically attached to a rectangular or square-shaped pad of a metallic leadframe; the pad is surrounded by leads as input/output terminals. In other power switching devices, the power MOSFET chips and the driver-and-controller IC are assembled horizontally side-by-side on a single leadframe pad, which in turn is surrounded on all four sides by leads serving as device output terminals. The leads are commonly shaped without cantilever extensions, and arranged in the manner of Quad Flat No-Lead (QFN) or Small Outline No-Lead (SON) devices. The electrical connections from the chips to the leads may be provided by bonding wires, which introduce, due to their lengths and resistances, significant parasitic inductance into the power circuit.

In some recently introduced advanced assemblies, clips substitute for many connecting wires. These clips are wide and made of thick metal and thus introduce minimum parasitic inductance. Each assembly is typically packaged in a plastic encapsulation, and the packaged components are employed as discrete building blocks for board assembly of power supply systems.

In other recently introduced schemes, the control FET chip and the sync FET chip are assembled vertically on top of each other as a stack over the leadframe pad, with the physically larger-area chip of the two attached to the leadframe pad, and with clips providing the connections to the switch node and the stack top. Independent of the physical size, the sync FET chip needs a larger active area than the active area of the control FET chip, due to considerations of duty cycle and conduction loss. When both the sync chip and the control chip are assembled source-down, the larger (both physically and active area) sync chip is assembled onto the leadframe pad and the smaller (both physically and active area) control chip has its source tied to the drain of the sync chip, forming the switch node, and its drain to the input supply $V_{IN}$. A first clip is connected to the switch node between the two chips; an elongated second clip of the stack top is tied to input supply $V_{IN}$. The pad is at ground potential and serves as a spreader of operationally generated heat. The driver-and-control IC chip is assembled horizontally side-by-side near the stack of chips and clips and connected by bonding wires with the FET gates and the leadframe leads. Due to their forms and materials, the clips and wire bonds have resistances and inductances, which contribute to the parasitics of the system.

A typical converter described in the last paragraph is depicted in FIG. 1A, generally designated 100. The control MOS field effect transistor (FET) 110 is stacked upon a synchronous (sync) MOSFET 120. The control FET chip 110 of this exemplary module has a smaller area relative to sync FET chip 120. A QFN metal leadframe has a rectangular flat pad 101, which serves as output terminal and is destined to become the heat spreader of the package; the leads 102a and 102b are positioned in line along two opposite sides of the pad. The stacking of the FET chips is accomplished by the so-called source-down configuration: The source of sync FET 120 is soldered to the leadframe pad 101 by solder layer 121. The low side clip 140, soldered by solder layer 122 onto the drain of sync FET 120, has the source of control FET 110 attached by solder layer 111. Consequently, low side clip 140 thus serves as the switch node terminal of the converter. The high side clip 160 is connected by solder layer 112 to the drain of control FET 110. High side clip 160 is attached to lead 102b of the leadframe and thus connected to the input supply $V_{IN}$. The low side clip 140 and the high side clip 160 are gang placed. The driver and controller chip 130 is attached by solder layer 132 to pad 101. Wires 133 provide the connections of the chip terminals and FET gate terminals (110b, 120b, 120d). The converter of FIG. 1 has a height 191 of 1.5 mm and a rectangular footprint with a length 192 of 6 mm and a width 193 of 5 mm. In other known converters with smaller chips, the driver chip may be placed in top of the second clip to save board area; for these converters, however, the bonding wires have to be excessively long with significant risk of wire sweep and electrical short during the encapsulation process. FIG. 1B shows a cutaway along phantom line marked 1B-1B.

In yet another recently introduced power system, the driver-and-control chip is included in the vertical stack on top of the second clip. This assembly structure saves real estate of the leadframe pad and thus the printed circuit board, but accepts the risk of very long downhill bonding wires and thus the risk of wire sweep and subsequent electrical shorts during the encapsulation process.

SUMMARY

Applicants realized that that the ongoing trend of employing DC-DC converters in new applications, such as automotive products, accelerates the long-standing drive towards miniaturization, lower power, higher frequency, and reduced cost. Symptoms of this trend are the pushes for reducing the height of the converters and reducing the electrical parasitics.

Applicants further realized that a step function improvement in reducing the height of DC-DC converters could be achieved when the metallic clips used in conventional converters could be eliminated without eliminating the function of the clips. Applicants solved the problem of reducing the height of the product while concurrently reducing the electrical parasitic resistances and inductances, when they discovered a method to eliminate both clips while retaining their function by assembling the sync and the control FET chips side-by-side in a pre-coined recess of the leadframe pad. As unexpected side benefits, it turned out that the new capability of attaching the FET terminals directly of a circuit board not only reduces the parasitics of the converter, but also substantially increases the thermal dissipation from active converter operation into heat sinks of circuit boards. As a consequence, the power handling and the operational frequency of the converter are improved.

One embodiment of the invention is a DC-DC converter, which uses a QFN leadframe with leads and a pad. The pad surface facing a circuit board has a portion recessed with a depth and an outline suitable for attaching side-by-side the sync FET chip and the control FET chip. The input terminal of the control FET and the grounded output terminal of the sync FET are coplanar with the un-recessed portion of the pad, which is tied to the switch node terminal. Due to the co-planarity, all terminals can be directly and simultaneously attached to contacts of a circuit board. The durect attachment reduces the thermal resistance significantly and improves the heat dissipation to a heat sink of the circuit board. Thus, the operating frequency of the converter is enhanced (beyond 1 MHz). The driver-and-control chip is vertically stacked to the opposite pad surface and encapsulated in a packaging compound.

Another embodiment of the invention is a method fabricating a power supply system. The pad of a QFN leadframe has a first and a second surface; the first pad surface has been pre-coined to have a portion recessed with a depth and an outline suitable for attaching semiconductor chips. A driver-and-control chip is attached to the second pad surface, wire bonded to respective leads, and encapsulated in a packaging compound, which leaves the first pad surface un-encapsulated. A first FET chip (the sync FET chip) is attached with its drain terminal to the recessed portion of the first pad surface so that the source and gate terminals of the first FET chip are co-planar with the un-recessed portion of the first pad surface. In addition, a second FET chip (the control FET chip) is attached with its source terminal to the recessed portion of the first pad surface so that the drain and gate terminals of the second FET chip are co-planar with the un-recessed portion of the first pad surface.

Compared to conventional structure and fabrication methods of power supply systems, the invention eliminates both clips without abandoning their functions, thereby saving height of the assembled system. The invention further eliminates the corresponding clip assembly steps; and saving time and cost in the assembly process flow. The height of the finished device is further reduced by embedding both FET chips side-by-side into the partially thinned leadframe pad. Since the terminals of the assembly FET chips are coplanar with the leadframe pad terminal, all terminals can be attached to a circuit board simultaneously and directly. By avoiding thermal resistances, heat dissipation to heat sinks in the circuit boards is drastically improved, enhancing the frequency of converter operation beyond 1 MHz.

DETAILED DESCRIPTION OF PREFERRED EMBODIMENTS

Figure 2A:
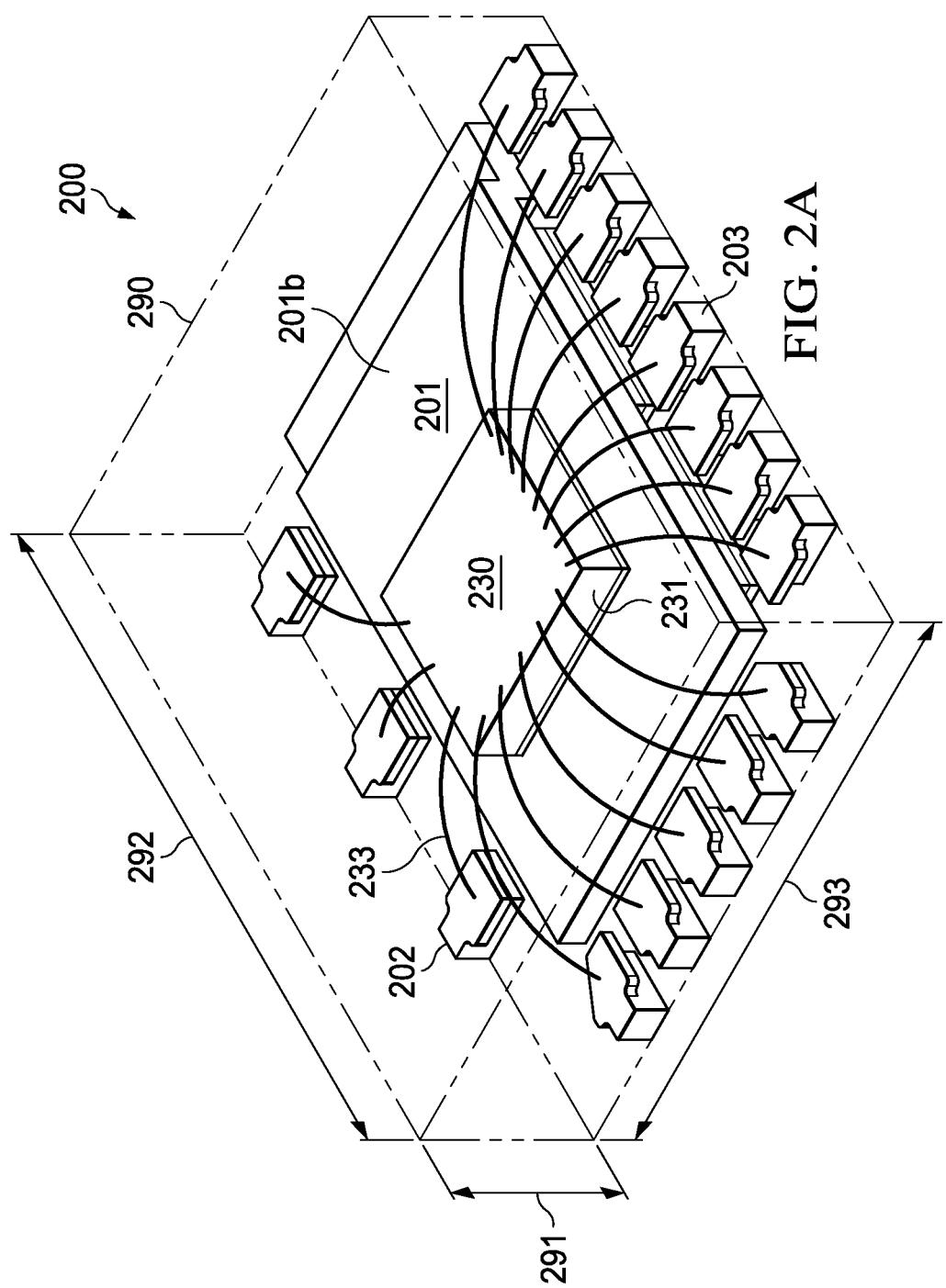
FIG. 2A illustrates a perspective top view of a packaged DC-DC synchronous Buck converter according to the invention, with the driver-and-controller chip attached to the top side of a leadframe pad and the package compound encapsulating chip and wire bonds.
Figure 2B:
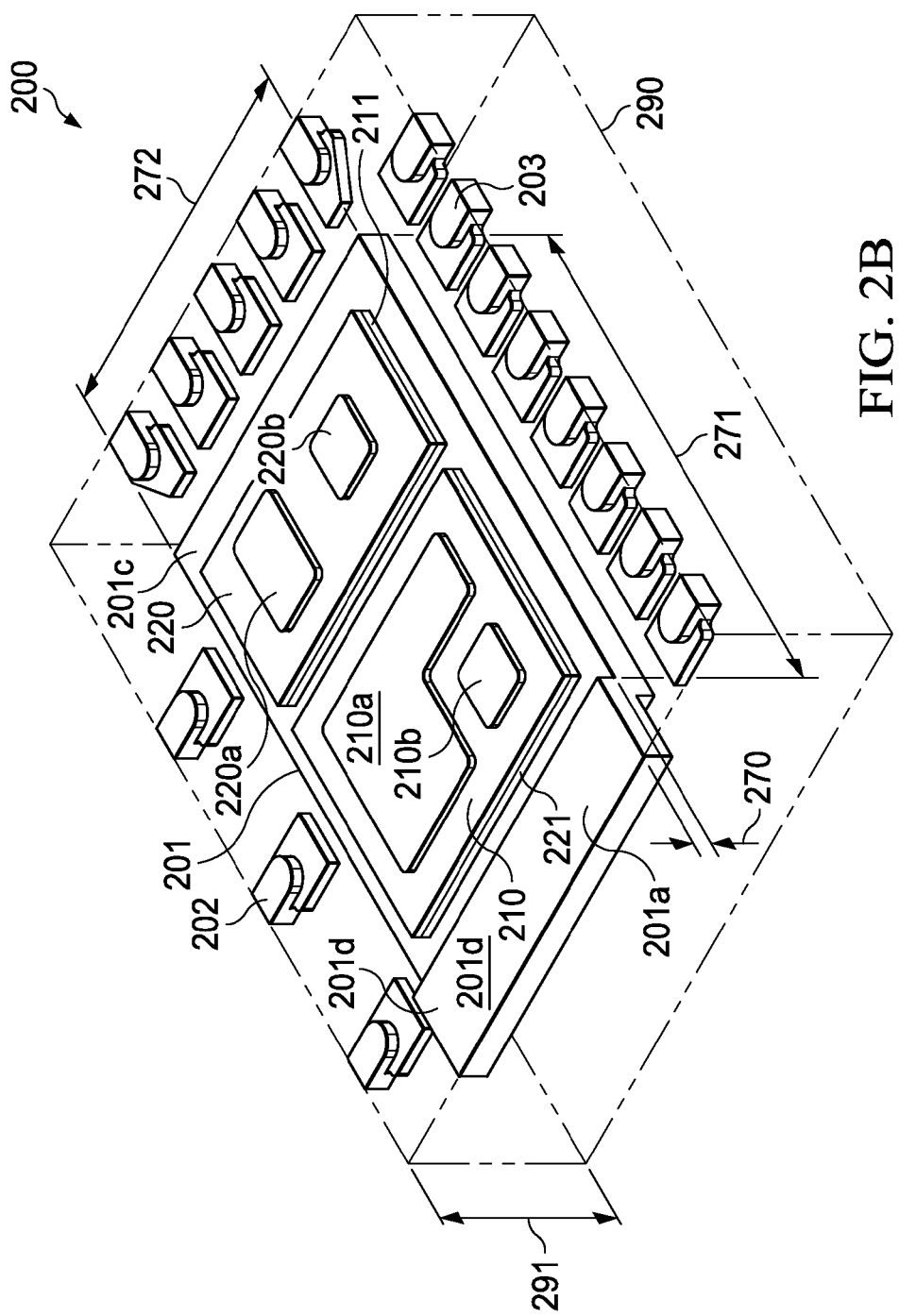
FIG. 2B shows a perspective bottom view of the DC-DC converter of FIG. 2A, with both adjacent FET chips attached to the bottom side of the leadframe pad and coplanar FET terminals un-encapsulated to beg attachable to a circuit board.

FIGS. 2A and 2B illustrate perspective views of a power supply module generally designated 200 as an exemplary embodiment of the invention, FIG. 2A as a top view, FIG. 2B as a bottom view. For explanatory reasons, module 200 is shown with a transparent encapsulation 290. Preferred actual encapsulation uses a black-colored epoxy formulation suitable for a transfer molding technology. The exemplary module of FIGS. 2A and 2B has a thickness 291 in the range from 0.7 to 0.8 mm and a rectangular footprint with a module length 292 of 4.8 mm and a width 293 of 3.0 mm. Other pads may be square-shaped.

Visible through the transparent encapsulation is a metal leadframe generally suitable for Quad Flat No-Lead (QFN) and Small Outline No-Lead (SON) type modules. The leadframe includes a rectangular pad 201 and a plurality of leads 202 and 203. The pad surface visible in FIG. 2B is the first surface 201a, the pad surface visible in FIG. 2A is the second surface 201b. The leadframe is preferably made of copper or a copper alloy; alternative metal selections include aluminum, iron-nickel alloys, and Kovar™. Both surfaces of the leadframe may be prepared to facilitate epoxy adhesive attachment, for instance by a roughened surface; when other embodiments may use a solder as attachment, the leadframe surface preparation may include a layer of tin, or a sequence of plated layers of nickel, palladium, and gold. In addition, at least one surface may have a metal layer deposited to enhance thermal conductivity, for instance by a plated layer of silver. Preferred thickness of the starting metal for the exemplary embodiment shown in FIGS. 2A and 2B is in the range from 0.2 mm to 0.4 mm; other embodiments may use thicker or thinner leadframe metal. From the standpoint of low cost and batch processing, it is preferred to start with sheet metal and fabricate the leadframe as a strip by stamping or etching, and to singulate the leadframe for the module by trimming the strip after the encapsulation process. Electrically, pad 201 is tied to the switch node terminal $V_{SW}$ of the power supply system.

As illustrated in FIG. 2B, first pad surface 201a has a portion 201c offset by a step 270 relative to portion 201d. Furthermore, portion 201c has an outline (length 271 and width 272) suitable for attaching semiconductor chips. The process of offsetting the pad is preferably accomplished by coining during the fabrication process of the leadframe. Alternatively, an etching process may be used; as an example, a chemical etching process may be performed so that only those surfaces (for instance copper or aluminum) are attacked which are not protected by an oxidized metal or a very thin gold layer.

In the example of FIG. 2B, the chips of two semiconductor field effect transistors (FETs) are attached to the recessed portion 201c of the leadframe pad. The first chip 210 is a drain-down FET, which represents the sync FET (low side FET) of a synchronous Buck converter. The second chip 220 is a source-down FET, which represents the control FET (high side FET) of a synchronous Buck converter.

FIG. 2B shows the sync FET (low side FET) chip 210 with a drain terminal of the FET chip attached to the recessed portion 201c of the first pad surface 201a. Herein, sync chip 210 is referred to as first FET chip. For the embodiment shown in FIG. 2B, first chip 210 has a size of about 3.5×2.84 mm, and a thickness of about 0.1 mm. For other embodiments, the chip size and the chip thickness may have significantly greater or smaller values. The attachment is preferably achieved by a layer 211 of conductive adhesive (epoxy), which can be polymerized (cured); an alternative is a z-axis conductive polymer. The preferred thickness of the adhesive layer is at least 25 μm. The conductive adhesive provides high thermal conductivity for spreading heat, since it is filled with metallic (preferably silver) particles. Preferably, the conductive adhesive is the same for all attachment processes of device 200 so that the polymerization process can be performed by a single process simultaneously for all attachments. After attachment, the source terminal 210a and the gate terminal 210b are co-planar with the surface 201a of the un-recessed portion of the first pad surface. The source terminal 210a is available, after flipping the finished device, to be attached (by solder or conductive adhesive) to the grounded output terminal $V_{OUT}$ ($P_{GND}$) on the circuit board. This attachment action also ties the sync FET gate terminal 210b to the respective terminal on the board.

Adjacent to first FET chip 210, FIG. 2B shows the control FET (high side FET) chip 220 with a source terminal of the FET chip attached to the recessed portion 201c of the first pad surface 201a. Herein, control FET chip 220 is referred to as second FET chip. For the embodiment shown in FIG. 2B, second chip 220 has a size of about 2.5×1.8 mm, and a thickness of 0.1 mm. For other embodiments, the chip size and the chip thickness may have significantly greater or smaller values. The attachment is preferably achieved by a layer 221 of conductive adhesive (epoxy), which can be polymerized (cured); an alternative is a z-axis conductive polymer. The preferred thickness of the adhesive layer is at least 25 μm. The conductive adhesive provides high thermal conductivity for spreading heat, since it is filled with metallic (preferably silver) particles. After attachment, the drain terminal 220a and the gate terminal 220b are co-planar with the surface 201a of the un-recessed portion of the first pad surface. The drain terminal 220a is available, after flipping the finished device, to be attached (by solder or conductive adhesive) to the input terminal $V_{IN}$ on the circuit board. This attachment action also ties the control FET gate terminal 210b to the respective terminal on the board.

As illustrated in FIG. 2A, attached to the second surface 201b of the leadframe pad 201 is integrated circuit (IC) chip 230, providing driver and controller functions for the power supply system. Chip 230 is attached to the second surface 201b of pad 201 preferably by a layer 231 of conductive adhesive (epoxy) of about 25 μm thickness, which can be polymerized (cured); an alternative is a z-axis conductive polymer. The conductive adhesive provides high thermal conductivity for spreading heat from chip 230 to pad 201, since it is filled with metallic (preferably solver) particles. Chip 230 may be rectangular and 0.2 mm thick, or it may be square shaped. Other embodiments may have chips, which are smaller or greater, and thicker or thinner. As illustrated in FIG. 2A, the terminals of chip 230 are wire bonded to respective leads 203. The preferred diameter of bonding wires 233 is about 25 μm, but may be smaller or greater. While this bonding configuration implies so-called downhill bonding operation, which requires care during the molding operation in order to for avoid wire sweep and the correlated touching of a wire and chip 230, the bonding in FIG. 2A has actually only low risk due to elongated wires and small height difference.

Figure 3:
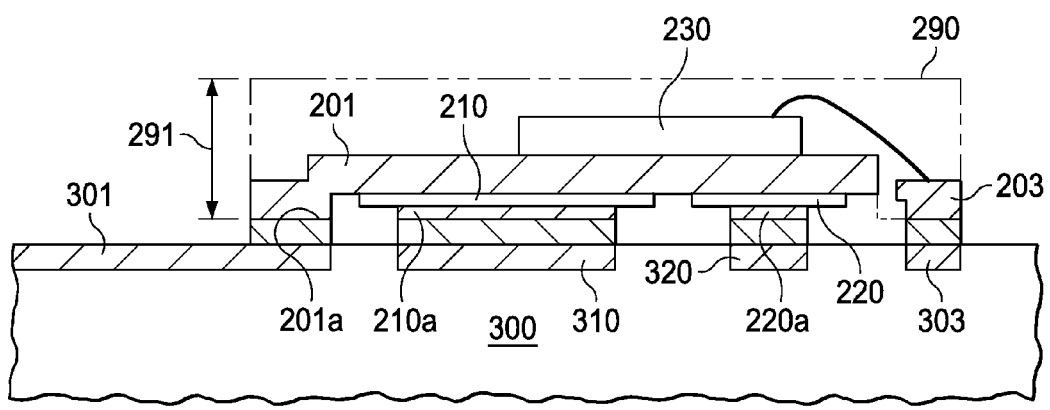
FIG. 3 depicts a cross section of the packaged converter of FIGS. 2A and 2B, with the terminals of the adjacent FET chips attached to respective contacts of a circuit board.

FIG. 3 illustrates the technical advantages of the invention for applications where the thinness of the converter is at a premium, or where the cooling of the converter has to be maximized for reaching high frequencies of operation. In this embodiment, the driver-and-controller chip is assembled on top of the leadframe as in FIG. 2A, and the height of the package is in the range between 0.7 mm and 0.8 mm. Both the low side FET 210 and the high side FET 220 are attached to the surface 201a of the recessed portion of the leadframe pad. The FET terminals 210a and 220a opposite the pad are co-planar with the surface 201a of the un-recessed portion of the pad surface. Terminals 210a and 220a are exposed so that they can be readily attached to pads 310 and 320, respectively, of a circuit board (PC board) 300. Concurrently, the un-recessed portions of the pad and the leads are attached to pads 301 of board 300. The attachment can be performed by conductive polymers and by solder. As FIG. 3 indicates, at least several of these board pads are extended as heat spreaders, or connected to heat sinks in the PC board. The direct attachment of the FET terminals to the circuit (PC) board and the effective cooling of heat spreaders and heat sinks in the PC board allows good cooling and thus low junction temperature of the FETs, and high efficiency and high frequency operation (1 MHz and above) of the converter.

Figure 1A:
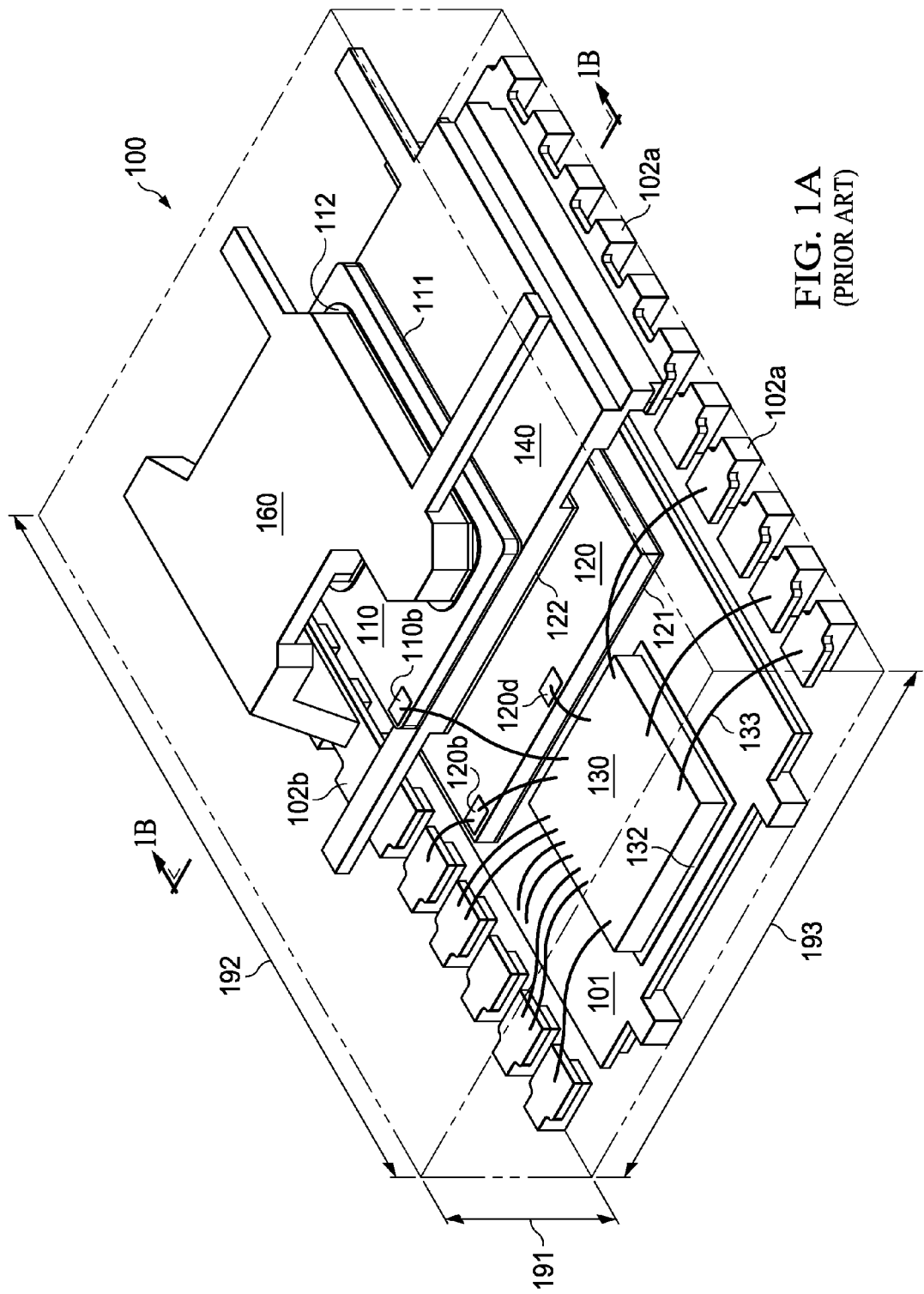
FIG. 1A shows a perspective top view of a packaged DC-DC synchronous Buck converter with the driver-and-controller chip assembled adjacent to the vertically stacked FET chips and two clips on a leadframe pad according to prior art.
Figure 1B:
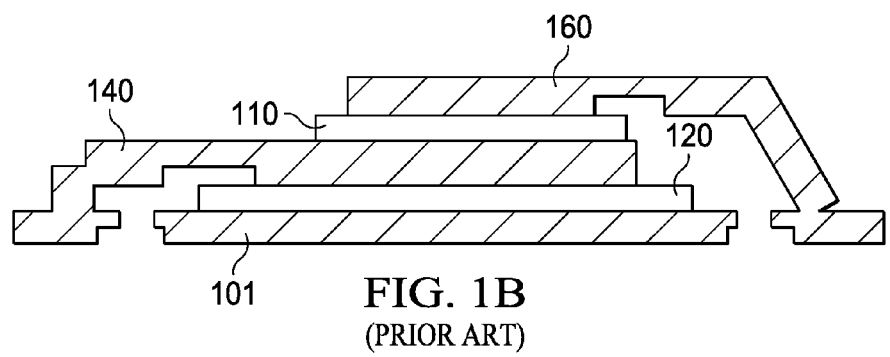
FIG. 1B depicts a cross section of the packaged stacked FET chips and clips of FIG. 1A according to prior art.
Figure 4:
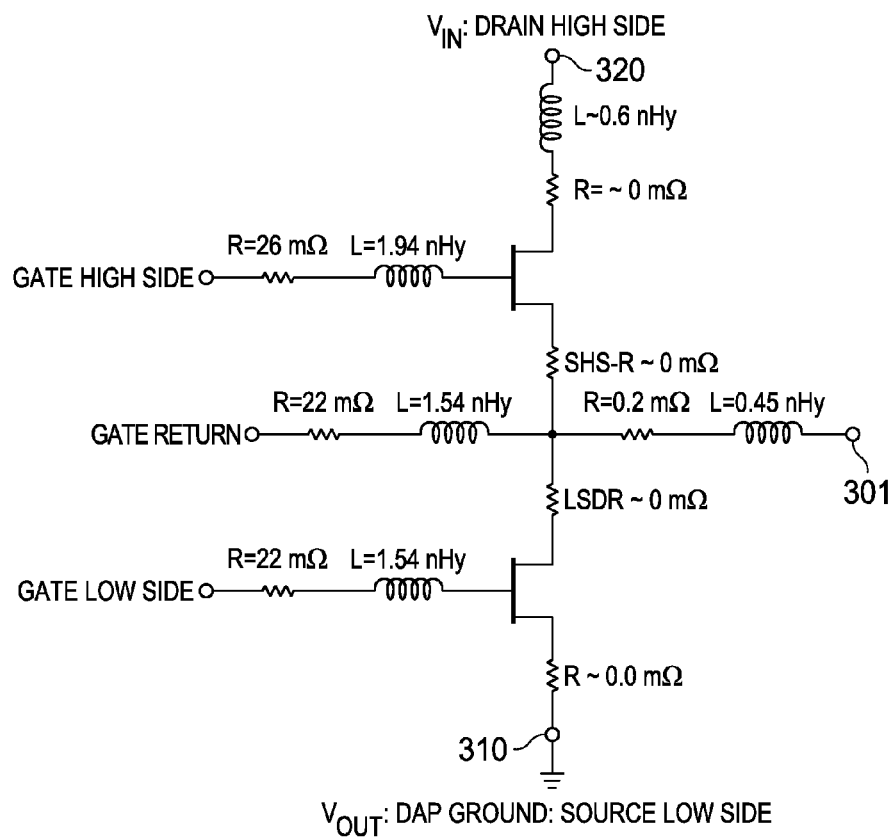
FIG. 4 displays a circuit diagram of the synchronous Buck converter of FIGS. 2A and 2B, identifying the elimination of electrical parasitics due to the avoidance of clips.

Assembling a synchronous Buck converter according to FIGS. 2A and 2B reduces parasitic inductances prevalent in conventional assembly. FIG. 4 specifies the improvements relative to the conventional assembly shown in FIG. 1. The electrical improvements originate from omitting both clips needed in the vertical stacking of the conventional assembly. By eliminating the high side clip (designated 160 in FIG. 1A), the drain terminal 220a of the high side FET 210 is directly mounted onto the $V_{IN}$ terminal 330 of the board. The high side clip resistance is eliminated and the high side source resistance is almost negligible. Thus, a parasitic resistance of about 0.5 mΩ and a parasitic inductance of about 0.6 nH from the omitted clip are avoided; the parasitic resistance and inductance the input terminal $V_{IN}$ have practically vanished.

By eliminating the low side clip (designated 140 in FIG. 1A), the source terminal 210a of the low side FET is directly mounted onto the grounded $V_{OUT}$ terminal 310 of the board. The low side clip resistance is eliminated and the low side source resistance is almost negligible. Thus, a parasitic resistance of about 0.5 mΩ and a parasitic inductance of about 0.6 nH from the omitted clip are avoided; the parasitic resistance and inductance the output terminal $V_{OUT}$ have practically vanished.

Concurrently, the un-recessed portion 201a of the pad is attached to pad 301 of board 300. Thereby, the pad of the leadframe is tied to the switch node terminal $V_{SW}$, designated 301 in FIG. 4. Resistance and inductance of the connection are small, about 0.2 mΩ and 0.45 nHy respectively. For the attachment, preferably the same attachment material (conductive adhesive or solder) is used, which is employed for the attachment of the terminals. In the same fashion, leads 203 are attached to board pads 303 by low resistance connections.

Figure 5:
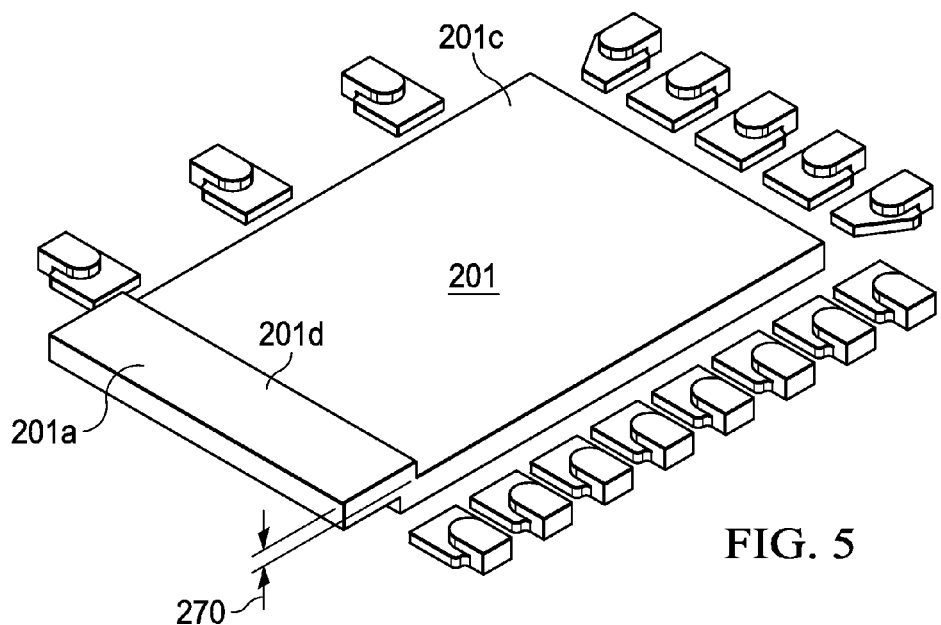
FIG. 5 shows a perspective bottom view of the stamped and coined leadframe, illustrating the pad portion recessed relative to the leads and the remaining pad portion.
Figure 6:
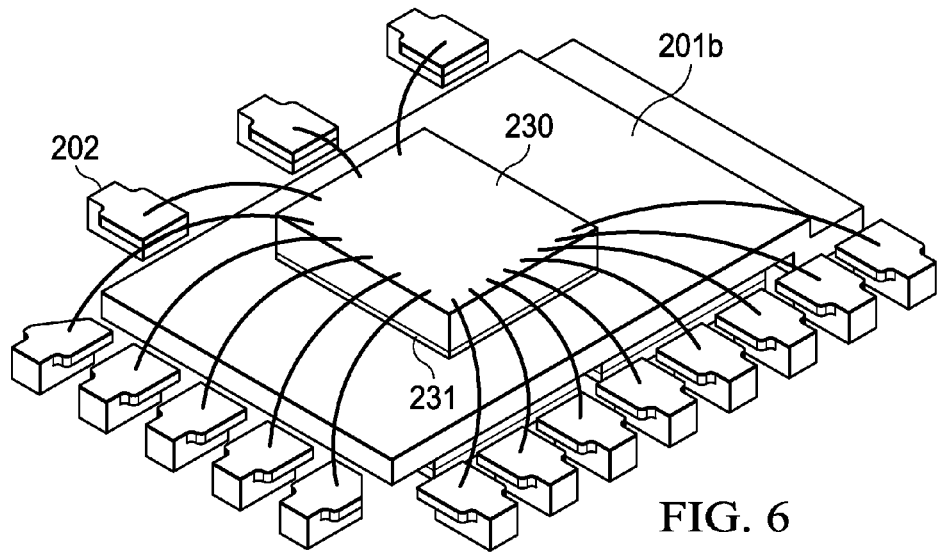
FIG. 6 shows a perspective top view of wire bonding the terminals of the driver-and-control chip to respective leads after the chip has been attached to the top side of the leadframe pad.
Figure 7:
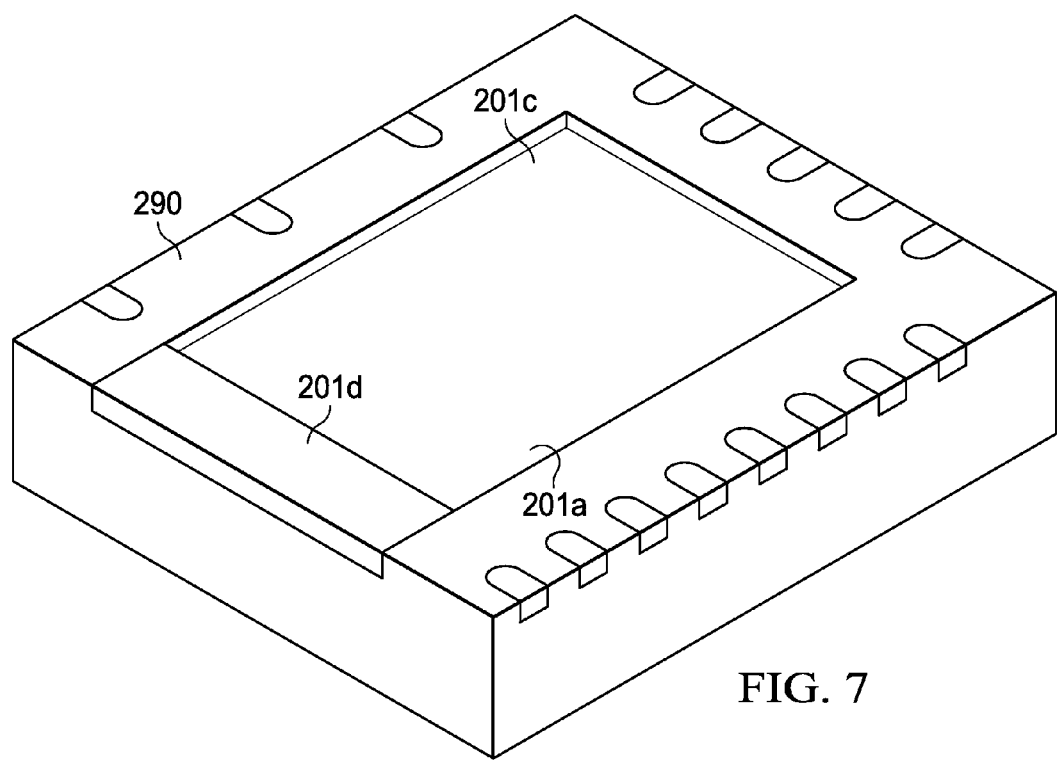
FIG. 7 depicts a perspective bottom view of the leadframe after encapsulating the driver-and-control chip, displaying the pre-coined recess portion of the leadframe pad.

Another embodiment of the invention is a method for fabricating a power supply DC-DC converter system with both semiconductor chips assembled so that terminals of both chips are directly attachable to a circuit board. Compared to prior art, the chips are embedded in an outside recess of a leadframe pad, which also serves as the switch node terminal; in this fashion, the conventional two clips are eliminated, and the number of process steps are reduced so that the method is low-cost compared to prior art and produces devices of small height and small area. FIGS. 5 to 7 depict certain steps of the assembly process flow.

The process flow starts in FIG. 5 by providing a leadframe, which is generally suitable for Quad Flat No-Lead (QFN) and Small Outline No-Lead (SON) devices. The view of FIG. 5 depicts the first surface 201a of the leadframe; the second surface 201b is depicted in FIG. 6. The exemplary leadframe of FIG. 5 has a rectangular pad 201; for other devices, the leadframe may have a square-shaped pad. Pad 201 will be tied to the switch terminal $V_{SW}$. The leadframe is preferably made of copper or a copper alloy; alternative metal selections include aluminum, iron-nickel alloys, and Kovar™. Both surfaces of the leadframe may be prepared to facilitate solder attachment, for instance by a sequence of plated layers of nickel, palladium, and gold. The starting thickness of the leadframe metal is in the range from 0.2 mm to 0.4 mm. It is preferred to start with sheet metal and fabricate the leadframe as a strip by stamping or etching, and to singulate the leadframe for the module by trimming the strip after the encapsulation process. The top view of FIG. 4 illustrates second surface 201b; the first surface 201a is intended to remain exposed outside the device package.

First pad surface 201a has a portion 201c offset by a step 270 relative to portion 201d. If the area of portion 201d is used as a reference plane, the area of portion 201c appears recessed relative to area of portion 201d. Furthermore, portion 201c has an outline (length 271 and width 272) suitable for attaching at least two semiconductor chips. The offset of the pad is preferably accomplished by a coining technique during the fabrication process of the leadframe. The step 270 may be smaller than, equal to, or greater than the starting metal thickness. The height of step 270 is selected so that it is equal to the sum of the height of a semiconductor chip-to-be-attached and the height of the adhesive attachment layer.

Alternatively, an etching process may be used; as an example, a chemical etching process may be performed so that only those surfaces (for instance copper or aluminum) are attacked which are not protected by an oxidized metal or a very thin gold layer. For some applications, the etched step may be about half of the pad thickness; consequently, a leadframe with portions of such recess is sometimes referred to as half-etched or partially etched leadframe.

FIG. 6 is a top view of the second surface 201b of the leadframe. FIG. 6 depicts the processes of attaching chip 230 with the driver and controller IC to the second surface 201b of the leadframe pad, and of connecting the chip terminals to respective leadframe leads by bonding wires. For the process of attaching, preferably a layer 231 of conductive adhesive (epoxy) of about 25 µm thickness is employed, which can be polymerized (cured); an alternative is a z-axis conductive polymer.

The next process, depicted in FIG. 7 (bottom view), includes the encapsulation of the driver-and-control chip 230 in a packaging material, preferably a molding compound 290. The bottom view of FIG. 7 shows that the first pad surface 201a remains un-encapsulated. This un-encapsulated first surface 201a includes the offset portion 201c, which has a depth 270 from portion 201d, and lateral dimensions suitable for attaching semiconductor chips.

Figure 8:
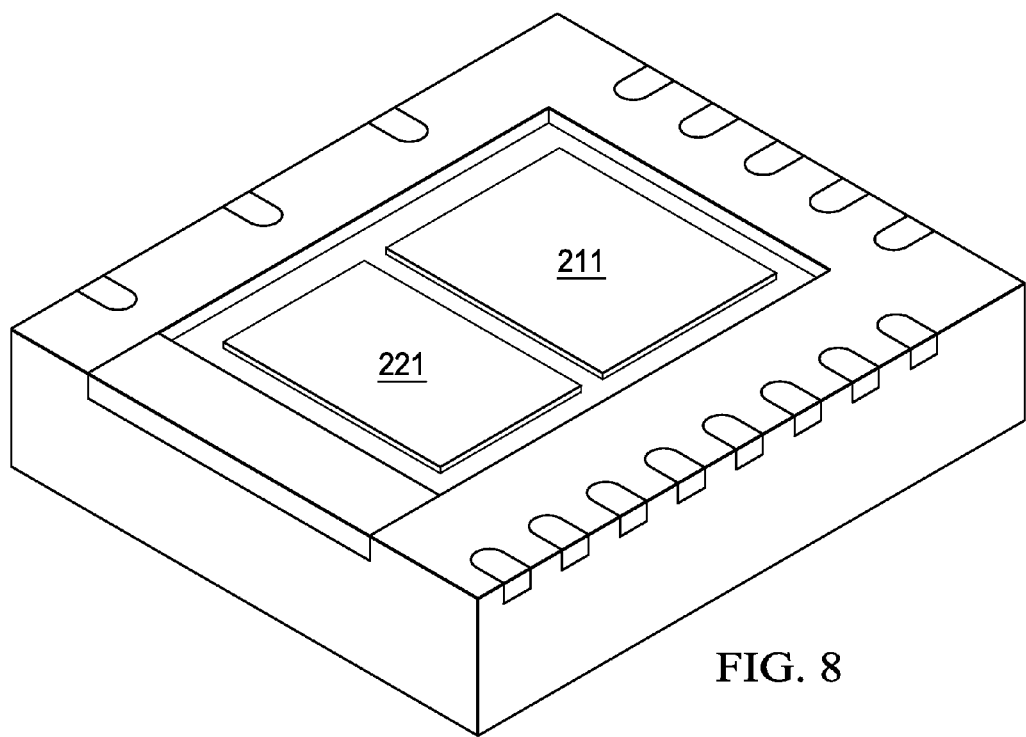
FIG. 8 shows the perspective bottom view of FIG. 7 after depositing the adhesive polymeric layers for attaching the sync and control FET chips.

FIG. 8 depicts the next process, the dispensing or screen printing of layers 211 and 221 of conductive adhesive (epoxy), which can be polymerized (cured). An alternative is a z-axis conductive polymer. Preferred layer thickness is about 25 µm. The adhesive is selected so that the material is suitable for all attachment joints of the product; all adhesive layers can thus undergo the process of polymerization at an elevated temperature simultaneously during a common curing step.

The result of the next processes, the attachment of the FET chips, is shown in FIG. 2B. The first FET chip 210, also called the sync or low side FET, is attached to adhesive layer 211 and thus onto the offset portion 201c of first pad surface 201a. The low side FET has a drain-down design and is attached with its drain terminal on the adhesive layer. Source and gate terminals are facing away from the pad surface 201a; after attachment, source terminal 210a and gate terminal 210b of FET chip 210 are coplanar with the pad surface of portion 201d and thus also co-planar with the leads 202 and 203. Due to the co-planarity, source terminal 210a can be attached (for instance by solder or by conductive adhesive) to a PC board terminal functioning as input $V_{OUT}$ to the system. This direct attachment of the first chip to the board has the advantage of eliminating parasitic resistance and inductance, and enhancing the heat dissipation during system operation from the system directly into a heat sink of the board.

Next, the second FET chip 220, also called the control or high side FET, is attached to adhesive layer 221 and thus onto the offset portion 201c of first pad surface 201a. The high side FET has a source-down design and is attached with its source terminal on the adhesive layer. Drain and gate terminals are facing away from the pad surface 201a; after attachment, drain terminal 220a and gate terminal 220b of FET chip 220 are coplanar with the pad surface of portion 201d and thus also co-planar with the leads 202 and 203. Due to the co-planarity, drain terminal 220a can be attached (for instance by solder or by conductive adhesive) to a PC board terminal functioning as input $V_{OUT}$ to the system. This direct attachment of the second chip to the board has the advantage of eliminating parasitic resistance and inductance, and enhancing the heat dissipation during system operation from the system directly into a heat sink of the board.

As mentioned, the construction of device 200 and the fabrication process flow offer the opportunity to employ only conductive (metal-filled) polymeric compounds for assembly and to polymerize all compound layers simultaneously. In addition, when the direct attachment of the terminals of the FETs to a circuit board is also performed using a conductive polymer, the use of lead (Pb) for solders is completely omitted.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the high current capability of the power supply module can be further extended, and the efficiency further enhanced, by adding a heat spreader to the top surface of the package. In this configuration, the module is dual cooled and can dissipate its heat from both surface sides to heat sinks.

It is therefore intended that the appended claims encompass any such modifications or embodiments.

We claim:

1. A power supply system comprising:
   a Quad Flat No-Lead (QFN)-type leadframe having a plurality of leads and a pad with a first and a second pad surface, the first pad surface having a recessed portion and an un-recessed portion, the recessed portion having a depth and an outline suitable for attaching a plurality of semiconductor chips, the pad tie-able to a switch node terminal of the system;
   a driver-and-controller chip attached to the second pad surface, said driver-and-controller chip having a plurality of terminals tied by bonding wires to respective leads of the lead frame, which will then pre-molded as a carrier with a exposed recessed surface;
   a package encapsulating the driver-and-controller chip, the wires and the second surface of the pad and leads, but leaving the first pad surface and at least some of the plurality of leads un-encapsulated creating a pre-molded carrier;
   a first Field Effect Transistor (FET) chip having a drain terminal of the first FET chip attached to the recessed portion of the first pad surface, and further having a source terminal of the first FET chip and the gate terminal co-planar with the un-recessed portion of the first pad surface, the source terminal of the first FET chip tie-able to a board terminal as a grounded output terminal of the system; and
   a second FET chip having a source terminal of the second FET chip attached to the recessed portion of the first pad surface, and further having a drain terminal of the second FET chip and the gate terminal co-planar with the un-recessed portion of the first pad surface, the drain of the second FET chip tie-able to a board terminal as an input terminal of the system.

2. The system of claim 1 wherein the first FET chip includes a drain FET, which serves as a low-side transistor attached to the recessed portion of the pre-molded carrier.

3. The system of claim 2 wherein the second FET chip includes a source down FET, which serves as a high-side transistor attached to the recessed portion of the pre-molded carrier.

4. A multichip semiconductor package comprising:
   a Quad Flat No-Lead (QFN)-type leadframe having a plurality of leads and a pad with a first and a second pad surface, the first pad surface having a recessed portion and an un-recessed portion, the recessed portion having a depth and an outline suitable for attaching a plurality of semiconductor chips, the pad tie-able to a switch node terminal of the system;
   a driver-and-controller chip attached to the second pad surface, said driver-and-controller chip having a plurality of terminals tied by bonding wires to respective leads of the lead frame, which will then pre-molded as a carrier with a exposed recessed surface;
   a package encapsulating the driver-and-controller chip, the wires and the second surface of the pad and leads, but leaving the first pad surface and at least some of the plurality of leads un-encapsulated creating a pre-molded carrier;
   a first Field Effect Transistor (FET) chip having a drain terminal of the first FET chip attached to the recessed portion of the first pad surface, and further having a source terminal of the first FET chip and the gate terminal co-planar with the un-recessed portion of the first pad surface, the source terminal of the first FET chip tie-able to a board terminal as a grounded output terminal of the system; and
   a second FET chip having a source terminal of the second FET chip attached to the recessed portion of the first pad surface, and further having a drain terminal of the second FET chip and the gate terminal co-planar with the un-recessed portion of the first pad surface, the drain of the second FET chip tie-able to a board terminal as an input terminal of the system.

5. The multichip semiconductor package of claim 4 wherein the first FET chip includes a drain FET, which serves as a low-side transistor.

6. The multichip semiconductor package of claim 5 wherein the second FET chip includes a source down FET, which serves as a high-side transistor.

7. The system of claim 2, wherein in the two attached transistors form a converter with the terminals tied through the recessed portion of the pre-molded carrier.

8. The system of claim 3, wherein in the two attached transistors form a converter with the terminals tied through the recessed portion of the pre-molded carrier.

* * * * *